United States Patent
Henneberg et al.

(10) Patent No.: US 7,508,666 B1
(45) Date of Patent: Mar. 24, 2009

(54) COOLING SYSTEM FOR ELECTRONIC EQUIPMENT

(75) Inventors: Mark A. Henneberg, Olathe, KS (US); Larry L. Johnson, Overland Park, KS (US)

(73) Assignee: Sprint Communications Company L.P., Overland Park, KS (US)

( * ) Notice: Subject to any disclaimer, the term of this patent is extended or adjusted under 35 U.S.C. 154(b) by 0 days.

(21) Appl. No.: 11/766,306

(22) Filed: Jun. 21, 2007

(51) Int. Cl.
*H05K 7/20* (2006.01)
*F28F 7/00* (2006.01)

(52) U.S. Cl. .................. 361/696; 165/80.4; 361/695; 361/701; 454/184; 62/259.2

(58) Field of Classification Search ............. 361/696, 361/700
See application file for complete search history.

(56) References Cited

U.S. PATENT DOCUMENTS

| | | | | |
|---|---|---|---|---|
| 5,467,609 A | * | 11/1995 | Feeney | 62/259.2 |
| 6,374,627 B1 | * | 4/2002 | Schumacher et al. | 62/259.2 |
| 6,616,524 B2 | * | 9/2003 | Storck et al. | 454/184 |
| 6,694,759 B1 | * | 2/2004 | Bash et al. | 62/180 |
| 7,286,351 B2 | * | 10/2007 | Campbell et al. | 361/696 |
| 2005/0207116 A1 | * | 9/2005 | Yatskov et al. | 361/690 |

* cited by examiner

*Primary Examiner*—Gregory D Thompson

(57) ABSTRACT

A cooling solution includes a system providing thermal energy dissipation for electronic equipment located in support racks or cabinets of a facility. According to one embodiment, the system is integrated with a facility where the support cabinets are locate. The system providing thermal energy dissipation includes a cooling loop, a fan unit for moving air across the cooling loop and one or more ducts forming a confined flow pathway for the moving air between the fan unit and cabinets for delivery to the electronic equipment. More specifically, the cooling loop contains a supply of circulating heat absorbing fluid such that the heat absorbing fluid removes thermal energy from the air moved by the fan unit. Each cabinet is formed with an exhaust pathway such that the moving air enters the cabinet from the duct, flows across the electronic equipment to remove thermal energy therefrom, and exits the cabinet.

15 Claims, 3 Drawing Sheets

COOLING SYSTEM FOR ELECTRONIC EQUIPMENT

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A cooling solution for electronic equipment located in support racks or cabinets is provided. In particular, the cooling solution includes a system and method that is well suited for providing thermal energy dissipation for computing equipment handing telecommunications and general networking activity, such as servers, routers, printed circuit boards, and the like.

In one aspect, a cooling system is integrated with a facility in which support cabinets are located on a surface of a facility (e.g., an elevated or raised floor, or a typical structural floor). The system includes a cooling loop as well as a fan unit located within or beneath the facility surface. The cooling loop contains a supply of circulating heat absorbing fluid and the fan unit is configured to move air across the cooling loop such that the heat adsorbing fluid removes thermal energy from the moving air. Additionally, the system includes one or more ducts forming a confined flow pathway for the moving air between the fan unit and cabinets. Each cabinet is formed with an exhaust pathway such that the moving air enters the cabinet from the duct, flows across the electronic equipment to remove thermal energy therefrom, and exits the cabinet. Cooling plates equipped with a circulating supply of heat absorbing fluid may be strategically positioned within each cabinet to dissipate thermal energy from specific electronic equipment components, or may be located outside the cabinets and exposed to the exhaust pathway of the moving air leaving the cabinets in order to maintain a desired temperature environments within the room of the facility where the cabinets are located. Alternatively, a heat exchanger may be located outside of the cabinets and exposed to the exhaust pathway of the moving air, in order to utilize the thermal energy from the exhaust air to perform other functions. Still further, the cooling loop may include a chiller system for removing thermal energy from the circulating heat absorbing fluid that is exposed the air flow from the fan unit.

In another aspect, a method provides thermal energy dissipation for network-based electronic equipment housed within one or more cabinets located on a surface of a facility. Each cabinet has an interior formed with a through passageway extending from an entrance at a first side of the cabinet to an exit at a second side of the cabinet. According to the method, both a cooling loop containing a supply of circulating heat absorbing fluid and a fan unit are utilized. The fan unit is configured to move air across the cooling loop such that the heat absorbing fluid removes thermal energy from the moving air. The moving air is then directed from the fan unit to the through passageway of the at least one cabinet such that the moving air flows across the electronic equipment to remove thermal energy therefrom, and exits the cabinet.

Additional advantages and features of the invention will be set forth in part in a description which follows, and in part will become apparent to those skilled in the art upon examination of the following, or may be learned by practice of the invention.

BRIEF DESCRIPTION OF THE SEVERAL VIEWS OF THE DRAWING

The present invention is described in detail below with reference to the attached drawing figures, wherein.

DETAILED DESCRIPTION

Embodiments of the present invention relate to a cooling solution for electronic equipment housed in support racks or cabinets within a facility. The cooling solution, although not limited to such an application, is well suited to provide thermal energy dissipation and management for equipment that produces a large amount of such energy, such as computers and other special purpose telecommunication or networking equipment. The solution provides a more targeted thermal energy dissipation scheme and preferably minimizes the floor space taken up in a facility for such cooling equipment. Additionally, the cooling solution may be positioned to maximize the thermal energy dissipation for the amount of cooling air flowing through the equipment housing cabinets.

Figure 1:
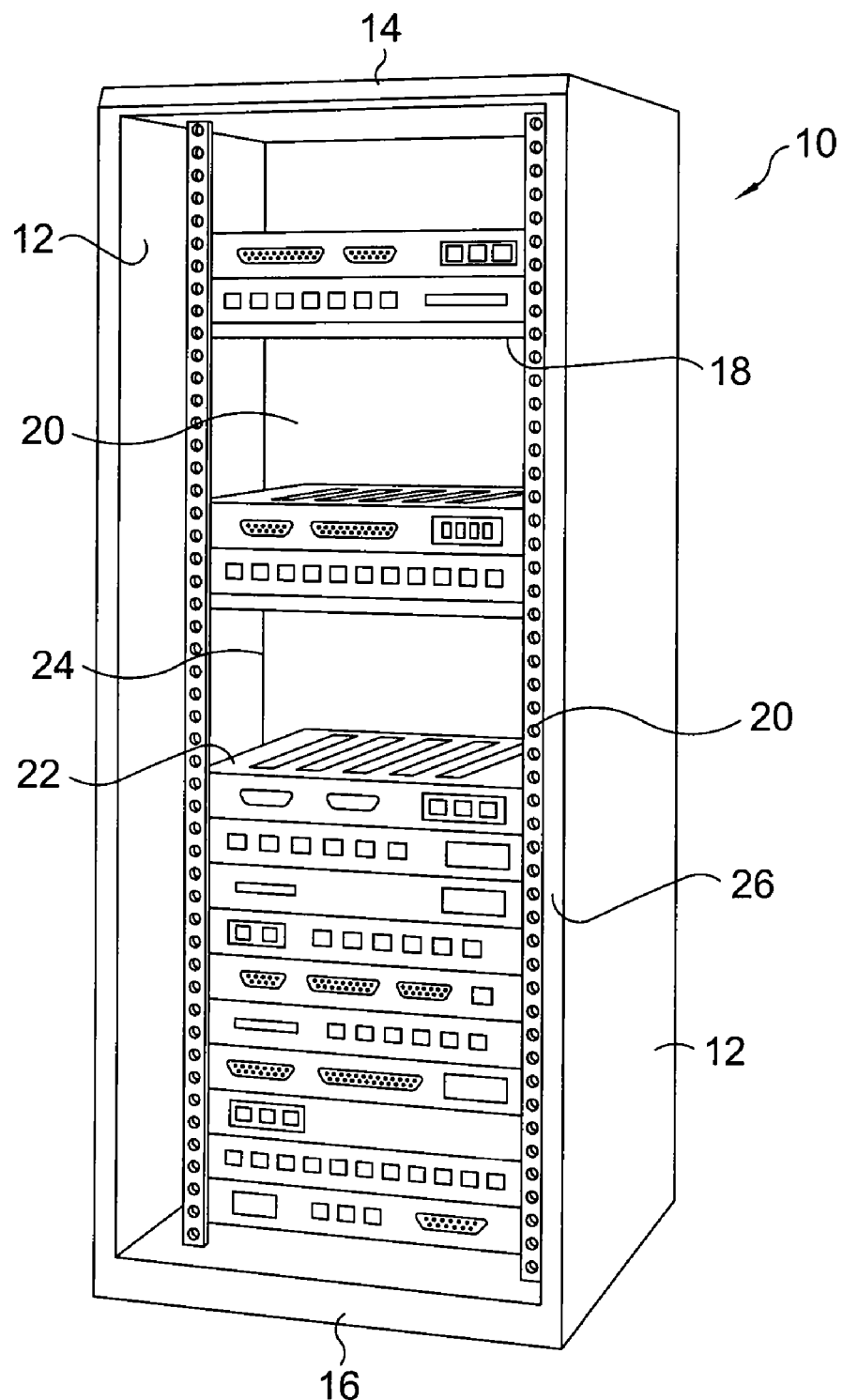
FIG. 1 is a perspective view of an examplary electronic device support cabinet in which various types of electronic equipment are housed.

Turning now to FIG. 1, an examplary electronic device housing rack, or cabinet 10, is shown. The cabinet 10 has sidewalls 12, a top cover 14 and a base 16, as well as a plurality of shelves 18. Each shelf 18 is mounted onto either the cabinet sidewalls 12 or to support columns 20 extending upwardly from the base 16. Each shelf 18 is configured to support one or more electronic devices 22, such as servers, routers, printed circuit boards, or other types of computing equipment. The electronic devices 22 are inserted into the cabinet 10 interior either through a front region 26 or a back region 24 of the cabinet 10. It should be understood that the cabinet 10 is merely a practical example of one configuration for an electronic equipment housing apparatus, and that other configurations may be utilized in conjunction with the cooling solution of the present invention.

Figure 2:
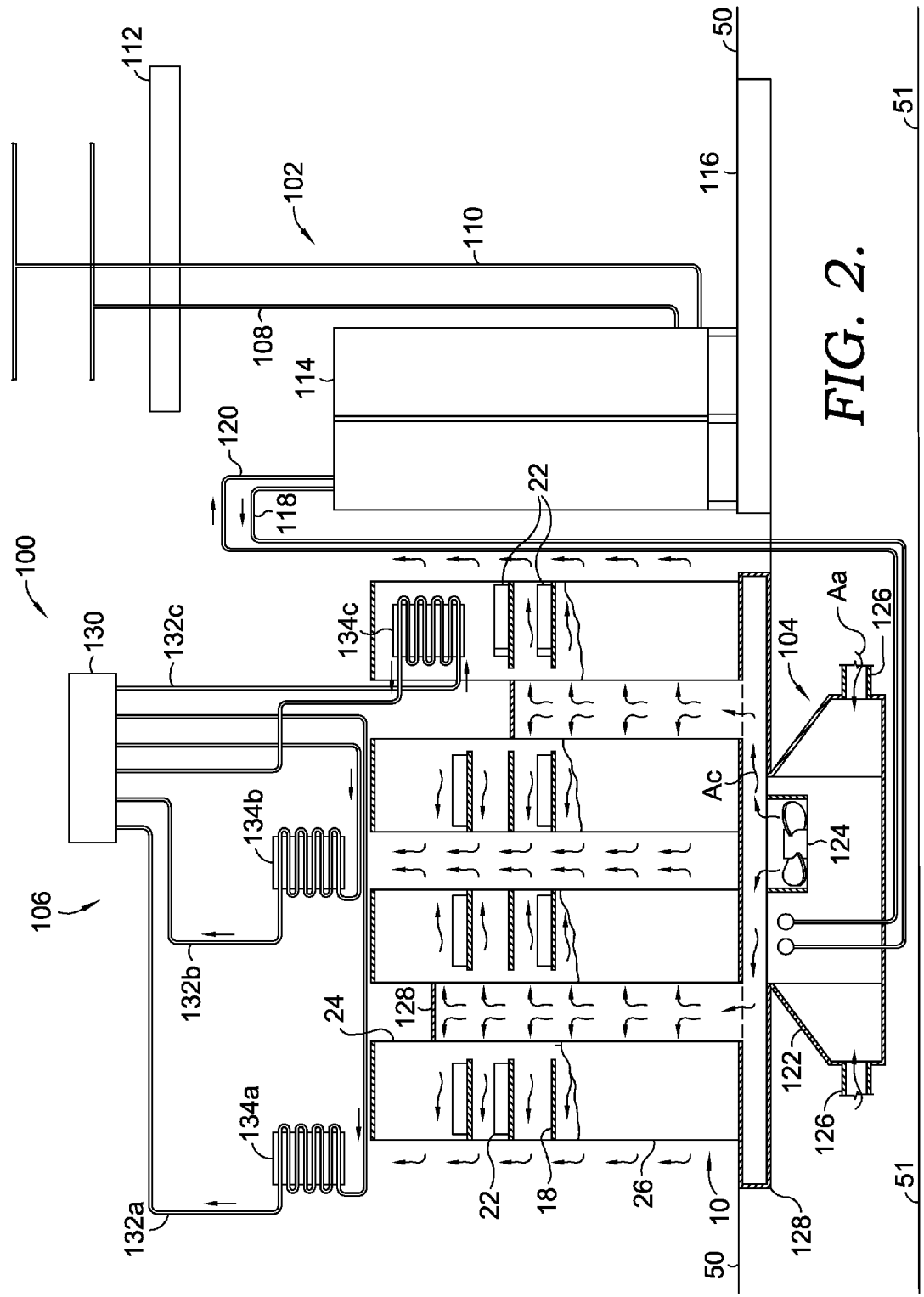
FIG. 2 is a schematic view of a cooling system for electronic equipment in accordance with one embodiment of the present invention.

With additional reference to FIG. 2, one embodiment of a cooling system 100 of the present invention is depicted. The cooling system 100 generally includes a primary cooling loop 102, a fan unit and intake housing 104, and a ducting structure 128, as well as the cabinets 10 housing the electronic equipment 22 producing the thermal energy. Additionally, a secondary cooling subsystem 106 may be provided proximal to (e.g., above) or within the cabinets 10 to act as a heat sink.

The primary cooling loop includes pipes 108, 110, 118, 120 for carrying a supply of heat absorbing fluid through a circulating pathway from a first location where heat absorbing fluid is brought to a cooled state to the fan unit 104 as a second location where the fluid absorbs thermal energy from air moving through the fan unit 104. The pipes 110 then carry the fluid from the second location back to the first location to give off the thermal energy absorbed from the air moving through the fan unit 104, thus brining the fluid back to the original cooled state. As a matter of reference the portion of the pipes carrying the cooled state fluid to the fan unit 104 from the first location, pipes 110 and 118, is referred to as a "supply line", and the portion of the pipes carrying the fluid that has absorbed thermal energy from the air moved through the fan unit 104 back to the first location, pipes 108 and 120 is referred to as a "return line". In an alternative arrangement, the return line may deliver the heat adsorbing fluid to a location other than the first location, such the the cooling loop does not function as a recirculating loop (i.e., the fluid leaves the loop after traveling the path through pipes 110, 118, 120 and 108) but is still, in a generic sense, "circulated" through the loop. This is particularly the case when the heat absorbing fluid is water. However, it should be understood throughout the embodiments of the cooling system 100 that the heat absorbing fluid could be any type of fluid having a desired specific heat value, such as water or various refrigerants.

According to one embodiment, the supply line (pipes 110 and 118) carries the chilled water supply for the facility in which in the system 100 is located, with the return line (pipes 120 and 108) carrying the chilled water return for the facility. Water catch trays 112 and 116 are provided to capture the condensation falling from the pipes 108 and 110. The use of facility chilled water for the primary cooling loop 102 may be alone, or in combination with a chiller system 114, such as a water-based chiller. In situations where facility chilled water is not supplied, the chiller system 114 may also be a refrigerant-based chiller, where refrigerants such as R-134a and similar compounds are utilized as the heat absorbing fluid of the cooling loop 102.

The fan unit 104 includes a general enclosure 122 serving as a housing for the unit 104, a fan assembly 124 and one or more intake ports 126 through which ambient air Aa is drawn into the enclosure 122. The fan assembly 124 pulls the ambient air Aa over the pipe 118 containing the heat absorbing fluid, such that the fluid draws thermal energy from the ambient air Aa to form cooled air Ac. The ducting structure 128 includes one or more continuous ducts which extend from the output of the fan assembly 124 to the back region 24 of each cabinet 10, to create a flow pathway for the cooled air Ac to one or more entrance openings in the cabinets 10 (i.e., at the back region 24). The cabinets 10 preferably reside on a raised support floor 50 of a room of the facility, with the fan unit 104 preferably located between the actual structural floor 51 of the facility and the raised floor 50. The ducting structure 128 extends through the raised floor 50 to reach the opening in the cabinets 10. The entrance openings are preferably chosen so as to maximize the flow of cooled air Ac across the electronic equipment 22 to an opposite side of the cabinet 10 to one or more exit openings (i.e., at the front region 26), forming an exhaust pathway for the moving air. For instance, as heated air naturally rises through convection, larger entrance opening may be needed at higher levels of the cabinet 10 as opposed to lower levels, to maintain a consistent cooling effect at various heights within the cabinet 10. Of course, the particular sizes, locations and configurations for the cabinet entrance and exit openings depends on a variety of factors, such as the location and types of electronic equipment 22 housed within the cabinet 10, the location of other cooling devices within the cabinet 10 or room in which one or more cabinets 10 are located, among other factors. At the same time, it is preferred that the entrance and exit openings are configured to encourage a cooled air Ac flow laterally or horizontally through the cabinets 10 that is, to at least some degree, perpendicular to the natural direction of rising heated air through natural convection.

Figure 3:
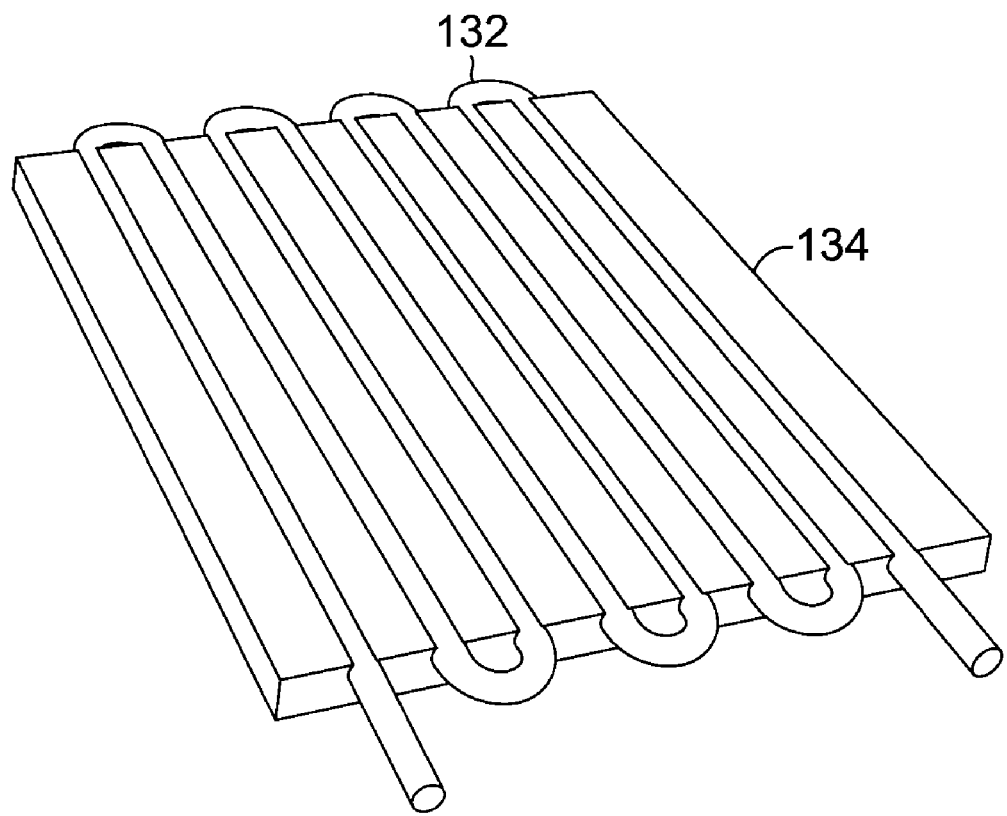
FIG. 3 is an perspective view of a chilling plate utilized with the cooling system of FIG. 2.

The secondary cooling subsystem 106 is generally positioned to receive the exhaust air flow leaving the exit openings (or open front) of the cabinet 10 at a downstream position, and to remove thermal energy from the air flow. Accordingly, portions of the secondary cooling system 106 may be located immediately outside of the front region 26 of each cabinet 10, or may be located further away from the cabinets 10 where the exhaust air tends to travel, for instance, generally above the cabinets 10 due to the rising of the heated air through natural convection. The secondary cooling system 106 may take the form of a general heat exchanger with a recirculating refrigerant capturing the thermal energy from the cabinet exhaust air, such that the thermal energy may be utilized for other proposes in the facility (e.g., to create steam, drive an engine, etc.). In one arrangement, the secondary cooling system 106 takes the form of a cold plate, or chilling plate, and cooling loop arrangement. Specifically, a heat exchanger 130 remove thermal energy from a heat absorbing fluid to place the fluid in a cooled state, and them pumps the fluid through cooling loop formed by a set of pipes 132a, 132b, 132c, or 132 generically, that circulate the fluid through a set of chilling plates 134a, 134b, 134c, or 134 generically. The plate 134, which are commonly formed of aluminum or other thermally conductive metals, act as heat sinks to absorb thermal energy from the cabinet exhaust air, with the circulating heat absorbing fluid removing the thermal energy from the plates 134. One suitable material for the pipes 132 is copper, due to the thermal conductivity of the metal and corrosion resistance. One example of a chilling plate 134 and pipe 132 arrangement is illustrated in FIG. 3.

In one alternative embodiment, the chilling plate 134 of the secondary cooling system 106 are located within one or more of the cabinets 10 (e.g., chilling plate 134c), to provide thermal energy dissipation closer to the source of heat generation (i.e., proximal to the electronic equipment 22). For instance, a number of chilling plates 134 may be positioned within a particular cabinet 10 at locations where higher relative densities of thermal energy are given off by the equipment 22, or where it is difficult to maintain an acceptable rate of flow of the cooling air Ac.

It should be understood that particular components of the cooling system 100, such as the fan unit 104, the secondary cooling system 106 and the chiller system 114, may be powered by conventional means, such as utility supplied AC electrical power, or by any other power supply devices, such as backup, failsafe power generation systems or other distributed power systems (e.g., fuel cell based systems, and the like). This is especially advantageous at telecommunications facilities, where if a main power supply is lost, but backup power is available to run the telecommunications equipment 22, then backup power supplies can also maintain power to the cooling system 100 to prevent overheating of the equipment. Furthermore, by utilizing distributed power systems, such as at remote telecommunications sites, the cooling system 100 may be powered without having to connect with a central electrical grid.

The various embodiments of the cooling solution of the present invention provide high density cooling that is targeted specifically to the telecommunications or other electronic equipment 22, reducing or eliminating the need to provide general air conditioning distributed throughout the room or enclosure where the equipment racks or cabinets 10 are located. For instance, if the facility or specific room where the cabinets 10 are located does not house a number of staff, or such persons otherwise spend a limited amount of time within the cabinet housing room, the system 100 eliminates the need to expend energy to cool the entire space of the room.

Many different arrangements of the various components depicted, as well as components not shown, are possible without departing from the spirit and scope of the present invention. Embodiments of the present invention have been described with the intent to be illustrative rather than restrictive. Alternative embodiments will become apparent to those skilled in the art that do not depart from its scope. A skilled artisan may develop alternative means of implementing the aforementioned improvements without departing from the scope of the present invention. It will be understood that certain features and subcombinations are of utility and may be employed without reference to other features and subcombinations and are contemplated to be within the scope of the claims.

What is claimed is:

1. A cooling system for a facility housing electronic equipment, the facility having a support surface on which a cabinet holding the electronic equipment is located, the system comprising:
   a cooling loop located beneath the support surface and containing a supply of circulating heat absorbing fluid;
   a fan unit located beneath the support surface and configured to move air across the cooling loop such that the heat adsorbing fluid removes thermal energy from the moving air;
   at least one duct forming a confined flow pathway for the moving air between the fan unit and the cabinet, wherein the cabinet is formed with a substantially lateral exhaust pathway such that the moving air enters via a back region of the cabinet, flows across the electronic equipment, housed by the cabinets, to remove thermal energy therefrom, and exits a front region of the cabinet; and
   a chilling plate positioned downstream of the flow of moving air exiting the cabinet such that the chilling plate is located outside of the front region of the cabinet, the chilling plate is coupled to a secondary cooling loop containing a supply of heat absorbing fluid.

2. The cooling system of claim 1, wherein an additional chilling plate is positioned within the cabinet proximate to the electronic equipment.

3. The cooling system of claim 1, wherein the cabinet has one or more openings in the back region and one or more openings in the front region, and an interior between the back region and the front region, such that the exhaust pathway extends from the one or more openings of the back region, through the interior to the one or more openings of the front region.

4. The cooling system of claim 1, wherein the cooling loop includes a chiller system for removing thermal energy from the heat absorbing fluid and reticulating the heat absorbing fluid through at least a portion of the cooling loop.

5. The cooling system of claim 4, wherein the heat absorbing fluid is water.

6. The cooling system of claim 4, wherein the heat adsorbing fluid is a refrigerant.

7. The cooling system of claim 1, further comprising:
   a heat exchanger positioned downstream of the flow of moving air exiting the cabinet and coupled to the secondary cooling loop.

8. A method for providing thermal energy dissipation for network-based electronic equipment housed within a plurality of cabinets located on a support surface of a facility, each of the plurality of cabinets having an interior formed with a through passageway extending from an entrance at a first side of each of the plurality of cabinets to an exit at a second side of each of the plurality of cabinets, the method comprising:
   providing a cooling loop containing a supply of circulating heat adsorbing fluid;
   providing a fan unit configured to move air across the cooling loop such that the heat adsorbing fluid removes thermal energy from the moving air;
   directing the moving air from the fan unit to the through passageway of each of the plurality of cabinets such that the moving air flows across the electronic equipment to remove thermal energy therefrom, and exits the plurality of cabinets; and
   providing a plurality of chilling plates positioned downstream of the flow of moving air exiting the plurality of cabinets such that one of the plurality of chilling plates is located outside of each of the plurality of cabinets, respectively, each of the plurality of chilling plates is coupled to a secondary cooling loop containing a supply of heat absorbing fluid.

9. The method of claim 8, wherein the plurality of cabinets comprises a pair of opposed cabinets, and the step of directing the moving air from the fan unit to the through passageway includes directing the moving air through a common duct extending from the fan unit to the entrance of each of the pair of opposed cabinets.

10. The method of claim 8, further comprising:
    providing an additional chilling plate positioned within one of the plurality of cabinets proximate to the electronic equipment; and
    moving the heat absorbing fluid through the secondary cooling loop to enable the plurality of chilling plates to remove thermal energy from the interior of the plurality of cabinets.

11. The method of claim 8, further comprising:
    moving the heat absorbing fluid through the secondary cooling loop to enable the plurality of chilling plates to remove thermal energy from the moving air exiting the plurality of cabinets.

12. The method of claim 8, wherein the cooling loop includes a chiller system for removing thermal energy from the heat absorbing fluid and recirculating the heat absorbing fluid through at least a portion of the cooling loop.

13. The method of claim 12, wherein the heat absorbing fluid is water.

14. The method of claim 12, wherein the heat absorbing fluid is a refrigerant.

15. The method of claim 8, further comprising:
    providing a heat exchanger at a position downstream of the flow of moving air exiting the plurality of cabinets; and
    removing thermal energy from the moving air existing the plurality of cabinets with the heat exchanger.

* * * * *

UNITED STATES PATENT AND TRADEMARK OFFICE
CERTIFICATE OF CORRECTION

PATENT NO. : 7,508,666 B1  Page 1 of 1
APPLICATION NO. : 11/766306
DATED : June 21, 2007
INVENTOR(S) : Henneberg et al.

It is certified that error appears in the above-identified patent and that said Letters Patent is hereby corrected as shown below:

Claim 4, Line 48, "reticulating" should read --recirculating--

Claim 15, Line 55, "existing" should read --exiting--

Signed and Sealed this

Twenty-second Day of December, 2009

David J. Kappos
*Director of the United States Patent and Trademark Office*

UNITED STATES PATENT AND TRADEMARK OFFICE
CERTIFICATE OF CORRECTION

PATENT NO. : 7,508,666 B1  Page 1 of 1
APPLICATION NO. : 11/766306
DATED : June 21, 2007
INVENTOR(S) : Henneberg et al.

It is certified that error appears in the above-identified patent and that said Letters Patent is hereby corrected as shown below:

Column 5, Claim 4, Line 48, "reticulating" should read --recirculating--

Column 6, Claim 15, Line 55, "existing" should read --exiting--

This certificate supersedes the Certificate of Correction issued December 22, 2009.

Signed and Sealed this

Twelfth Day of January, 2010

David J. Kappos
*Director of the United States Patent and Trademark Office*